United States Patent
Eker et al.

(10) Patent No.: US 11,081,771 B2
(45) Date of Patent: Aug. 3, 2021

(54) RF CROSSOVER APPARATUS FOR MICROWAVE SYSTEMS COMPRISING A BODY HAVING AT LEAST TWO INTERSECTING RF STRIPS DISPOSED THEREON AND INSULATED FROM AN EXTERNAL ENVIRONMENT

(71) Applicant: ASELSAN ELEKTRONIK SANAYI VE TICARET ANONIM SIRKETI, Ankara (TR)

(72) Inventors: Taylan Eker, Ankara (TR); Nihan Oznazli, Ankara (TR); Emrah Koc, Ankara (TR); Tuncay Erdol, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 0 days.

(21) Appl. No.: 16/482,725

(22) PCT Filed: Jun. 7, 2018

(86) PCT No.: PCT/TR2018/050292
§ 371 (c)(1),
(2) Date: Aug. 1, 2019

(87) PCT Pub. No.: WO2019/066756
PCT Pub. Date: Apr. 4, 2019

(65) Prior Publication Data
US 2019/0348741 A1 Nov. 14, 2019

(30) Foreign Application Priority Data
Jun. 9, 2017 (TR) .................................. 2017/08558

(51) Int. Cl.
*H01P 3/08* (2006.01)
*H01P 1/12* (2006.01)
(Continued)

(52) U.S. Cl.
CPC .............. *H01P 3/088* (2013.01); *H01P 1/127* (2013.01); *H01P 3/082* (2013.01); *H01P 5/028* (2013.01);
(Continued)

(58) Field of Classification Search
CPC ........ H01P 3/082; H01P 3/088; H01P 11/003; H05K 2201/09245
(Continued)

(56) References Cited

U.S. PATENT DOCUMENTS 3,104,363 A  9/1963 Butler
5,742,210 A  4/1998 Chaturvedi et al.
(Continued)

FOREIGN PATENT DOCUMENTS

EP  2869395 A1  5/2015
JP  H09186508 A  7/1997
(Continued)

OTHER PUBLICATIONS

Soon Young Eom, et al. Compact Broadband Microstrip Crossover with Isolation Improvement and Phase Compensation, IEEE Microwave and Wireless Components Letters, Jul. 7, 2014, vol. 24, No. 7.

*Primary Examiner* — Benny T Lee
(74) *Attorney, Agent, or Firm* — Bayramoglu Law Offices LLC

(57) ABSTRACT

An RF crossover apparatus provides low transmission and return losses for microwave systems and meets the requirement for the RF signals to leap over each other as in an insulated state. The RF crossover apparatus contains a body
(Continued)

produced from ceramic material, at least two RF strips placed inside the body in a way to intersect each other and at least one insulation layer insulating the RF strips placed on the body at least from the external environment. The body produced from ceramic material enables operation on high frequencies and this provides low transmission and return losses. The RE crossover apparatus also contains matching circuits on the tips of the RF strips for the RF strips to be passed to chip devices during use.

12 Claims, 5 Drawing Sheets

(51) Int. Cl.
  *H01P 5/02* (2006.01)
  *H01P 5/18* (2006.01)
(52) U.S. Cl.
  CPC .... *H01P 5/184* (2013.01); *H05K 2201/09245* (2013.01)

(58) Field of Classification Search
  USPC .............................................................. 333/1
  See application file for complete search history.

(56) References Cited

U.S. PATENT DOCUMENTS

| | | |
|---|---|---|
| 6,734,750 B1 * | 5/2004 | Ostergaard .............. H01P 3/088 333/1 |
| 8,969,733 B1 | 3/2015 | Mei et al. |
| 9,627,736 B1 * | 4/2017 | Ingalls .................... H01P 3/006 |
| 2004/0207482 A1 | 10/2004 | McAndrew et al. |
| 2014/0159836 A1 | 6/2014 | O'Neil et al. |
| 2014/0292450 A1 * | 10/2014 | Kato et al. ................ H01P 3/08 333/238 |

FOREIGN PATENT DOCUMENTS

| | | |
|---|---|---|
| JP | 2002368507 A | 12/2002 |
| JP | 2011055328 A | 3/2011 |

* cited by examiner

RF CROSSOVER APPARATUS FOR MICROWAVE SYSTEMS COMPRISING A BODY HAVING AT LEAST TWO INTERSECTING RF STRIPS DISPOSED THEREON AND INSULATED FROM AN EXTERNAL ENVIRONMENT

CROSS REFERENCE TO THE RELATED APPLICATIONS

This application is the national phase entry of International Application No. PCT/TR2018/050292, filed on Jun. 7, 2018, which is based upon and claims priority to Turkish Patent Application No. 2017/08558, filed on Jun. 9, 2017, the entire contents of which are incorporated herein by reference.

TECHNICAL FIELD

The invention is related to an RF (radio frequency) crossover apparatus used for low transmission and return losses in microwave systems.

BACKGROUND

Microwaves are waves having a wavelength between 1 mm and 1 m, in other words, having frequency between 300 GHz and 300 MHz. These waves are used especially in telecommunication systems, navigation systems, radars and astronomy.

Since the wavelengths of microwaves are nearly the same with the dimensions of the devices carrying the microwaves, the classical circuit theory loses validity in microwave electronics. When they come across with an obstacle at the level of their wavelengths, microwaves can overcome this obstacle and this results in serious problems with an insulation.

In the state of art, some methods have been developed in order to overcome this problem. For instance, paths which are supposed to cross over each other are transferred to a coaxial cable of microstrip and the crossover is provided as such. The crossover structure is large in this method and in addition, the transmission and return losses are excessive.

Another method in the state of art is enabled by ensuring that a line is crossed over another line by the use of gold strip. With this method, crossover band width is narrow.

In the RF (radio frequency) crossovers used for providing low transmission and return losses in microwave systems, the insulation between channels need to be as high as possible. In addition, interference which could be originating externally also causes noise in RF signals. For this reason, RF crossovers need to be also isolated from the external environment. In addition to that, the RF crossover needs to have high electrical performance. High frequency microwave systems require dimensionally small crossover structures and the RF crossover structures used for mass production microwave systems should be cost-efficient.

A ceramic based RF structure is mentioned in the United States patent document numbered US2014159836 in the state of art. In this structure, there is a ceramic based body and a strip line structure inside the body. However, RF strips crossing over each other do not take place in the embodiment.

SUMMARY OF THE INVENTION

An RF crossover apparatus meets the requirement for the RF signals to cross over each other as in an insulated state and provides low transmission and return losses for microwave systems is developed with the present invention. The RF crossover apparatus contains a body produced from ceramic material, at least two RF strips placed inside the body in a way to intersect each other and at least one insulation layer which provides for the RF strips placed on the body to be insulated at least from the external environment. The body produced from ceramic material enables operation on high RF and this provides for obtaining the low transmission and return losses. The RF crossover apparatus also contains matching circuits on the tips of the RF strips which provide for the RF strips to be passed on to chip devices during use.

In an embodiment of the invention, the RF crossover apparatus contains plural bodies assembled together by being placed on each other. In this embodiment of the invention, the subject RF crossover apparatus is produced by baking the bodies at high temperatures and piecing them together. With the purpose of providing the bodies with equipotential earthing, an earthing layer is applied on the outside facing surfaces of the bodies.

The purpose of the present invention is to provide an RF crossover apparatus for low transmission and return losses in microwave systems.

Another aim of the invention is to provide an RF crossover apparatus which eliminates the requirement of an additional matching circuit for chip devices in microwave systems.

BRIEF DESCRIPTION OF THE DRAWINGS

The application of the RF crossover apparatus for a microwave system developed with the present invention is shown in the attached figures for illustration purposes.

The parts in the figures are numbered and their references are given below:

| | |
|---|---|
| RF crossover apparatus | (A) |
| Body | (1) |
| RF strip | (2) |
| Insulation layer | (3) |
| Base part | (4) |
| Protective part | (5) |
| Matching circuit | (6) |
| Earthing layer | (7) |
| Perforated transition | (8) |
| Chip device | (9) |

DETAILED DESCRIPTION OF THE EMBODIMENTS

Figure 1:
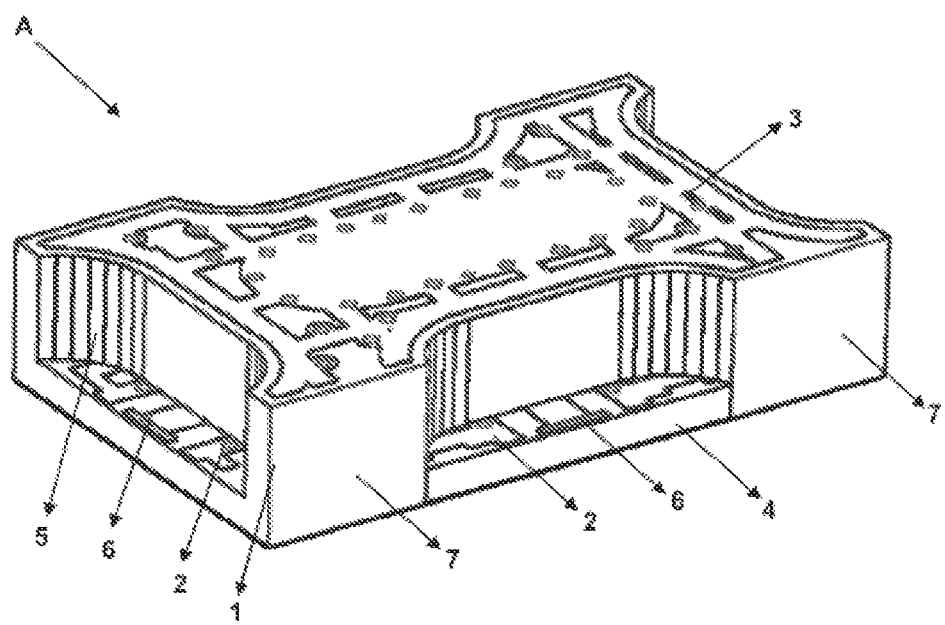
FIG. 1 is the perspective view of the RF crossover apparatus.
Figure 2:
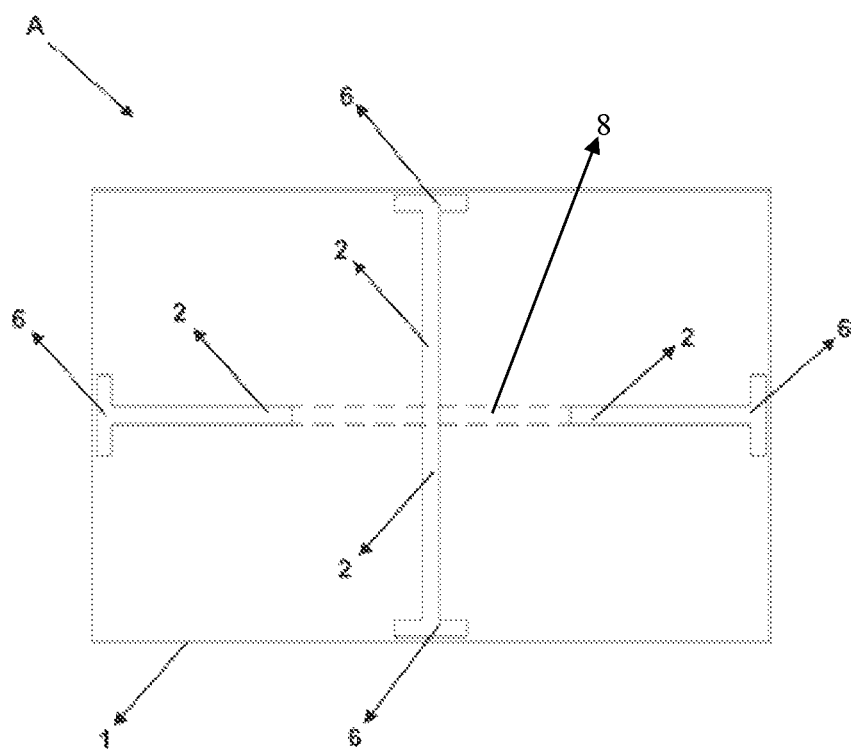
FIG. 2 is the top schematic view of the RF crossover apparatus.
Figure 3:
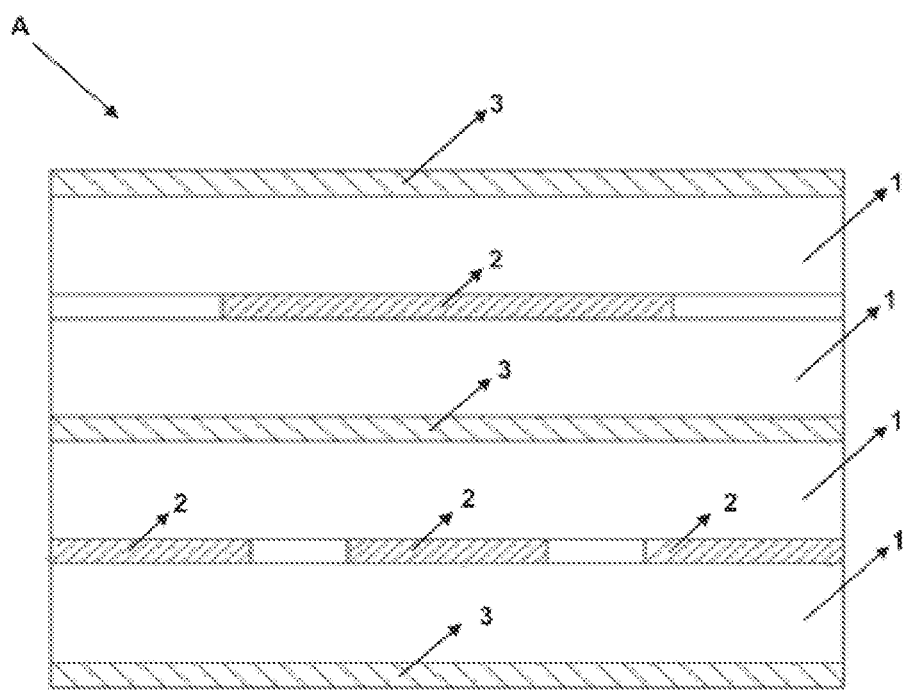
FIG. 3 is the cross-sectional view of a multilayer structure obtained by using RF crossover apparatuses.

The illustrative embodiments of the RF crossover apparatus (A) are presented in FIGS. 1-3 and is suitable for use in microwave systems and it comprises; at least one body (1), at least two RF strips (2) transmitting RF signals and placed on the body (1) so as to intersect each other and an insulation layer (3) as shown in FIGS. 1 and 3 takes place on at least one surface of the body (1) facing the external environment and insulating the RF strips (2) from the external environment. The body (1) of the RF crossover apparatus contains a base part (4) as shown in FIG. 1 on which RF strips (2) are placed and at least one protective part (5) as shown in FIG. 1 integrated with the base part (4) and extending outwards from the base part (4) in a way to at least partially cover the RF strips (2) placed on the base part (4). In the preferred embodiment of the invention, at least one of the RF strips (2) does not have contact with the protective part (5). In a derivative of the preferred embodiment of the invention, the RF strip (2) intersecting with the RF strip (2) which does not contact the protective part (5) extends towards the protective part (5) at the intersection point of the RF strips (2) and the two RF strips (2) intersect with an approximately 90 degrees angle. The body (1) containing the base part (4) and protective part (5) in the RF crossover apparatus (A) is produced from ceramic material which enables the RF strips (2) to operate on high frequencies (i.e. over 30 GHz). In a preferred specific embodiment of the invention, the body (1) is produced from a ceramic material which is low temperature sintered ceramic based (LTCC-Low Temperature Cofired Ceramic). In the preferred embodiment of the invention, the insulation layer (3) takes place on the surface of the protective part (5) which does not face RF strips (2). The insulation layer (3) contains at least one perforated transition (8) as shown in FIGS. 2 and 5 decreasing the transmission losses and increasing the spectral band by increasing insulation between the RF earthing material and RF strips (2).

Figure 5:
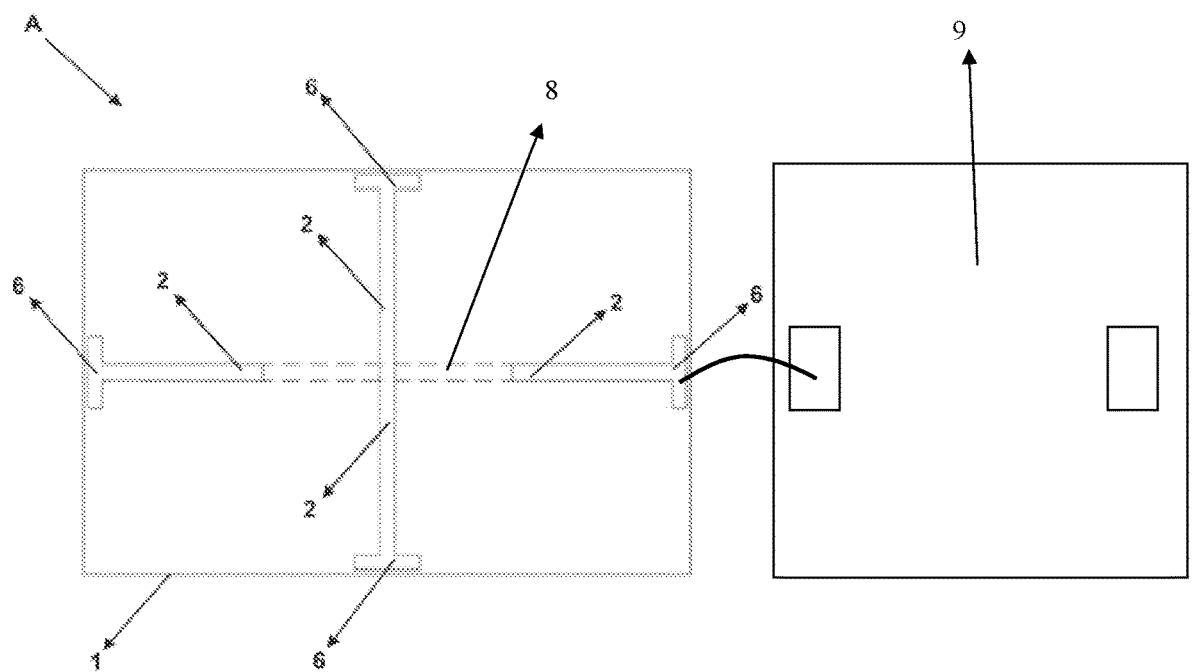
FIG. 5 shows the chip device of the present application.

In the preferred embodiment of the invention, RF crossover apparatus (A) also contains matching circuits (6) as shown in FIGS. 1 and 2 that provide transmission to chip devices (9), as shown in FIG. 5, used in microwave systems on the tips of the RF strips (2) on the base part (4) of base body (1). In the preferred embodiment of the invention, the matching circuits (6) are configured in a way to provide impedance matching with the chip devices (9). Thanks to the subject matching networks (6), operation of the crossover between the RF strips (2) over a wide frequency band and low transmission and return losses are obtained in the RF crossover apparatus (A). In addition to all of these, the necessity for an additional matching circuit for the chip devices (9) during applications is eliminated and applications become easier.

In an embodiment of the invention the RF crossover apparatus (A) contains plural bodies (1) placed on each other (FIG. 3). In this embodiment of the invention, the bodies (1) are connected together by baking at high temperatures (i.e. over 800° C.) and by this means, a durable and hermetic structure is obtained. In the subject embodiment, there is at least one earthing layer (7) as shown in FIG. 1 on the outside facing surfaces of the bodies (1) to provide equipotential earthing between the bodies (1). The earthing layer (7) is applied to the external surfaces of the bodies (1) after the bodies (1) are assembled together. In this embodiment of the invention, the insulation layer (3) preferably taking place on the protective layer (5) also provides the insulation between the RF strips in the bodies (1).

The RF crossover apparatus (A) enables to operate in high frequency thanks to the body (1) produced from ceramic material. In this way, low transmission and return losses are provided. The subject RF crossover apparatus (A) also protects the RF strips (2) against the noise that could be originating from the external environment while highly insulating the RF strips (2).

Figure 4:
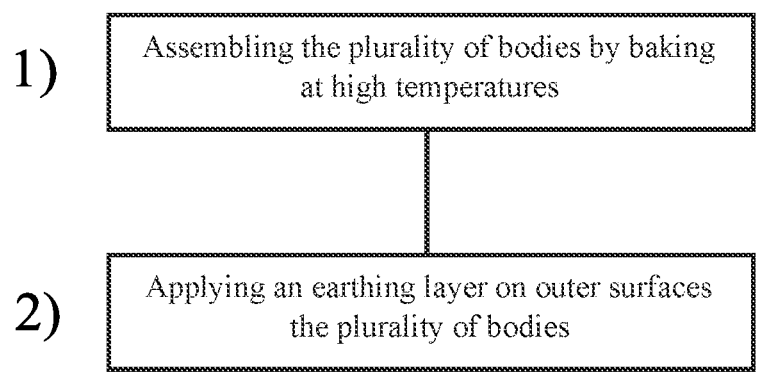
FIG. 4 shows the process steps of obtaining an RF crossover apparatus.

As shown in FIG. 4, the process comprises 1) assembling the plurality of bodies (1) by baking at high temperatures and 2) applying an earthing layer on outer surfaces of the plurality of bodies (1) after the plurality of bodies (1) are assembled.

As shown in FIG. 5, the RF crossover apparatus (A) includes a matching circuit (6), wherein the matching circuit provides transmission to chip devices (9) is provided in the microwave systems on tips of the at least two RF strips (2) on the body (1). The body (1) having RF strips (2) contains at least one perforated transition (8) as shown in FIGS. 2 and 5 decreasing the transmission losses and increasing the spectral band by increasing insulation between the RF earthing material and RF strips (2).

What is claimed is:

1. A radio frequency (RF) crossover apparatus suitable for a use with microwave systems, comprising: at least one body, at least two RF strips transmitting RF signals and placed to intersect each other on the body, and at least one insulation layer, wherein
    the at least one insulation layer is placed on at least one surface of the body and insulates the at least two RF strips at least from an external environment, and the body is formed of a ceramic material and is configured for an operation in high frequencies; and
    wherein the body comprises:
        a base part, wherein the at least two RF strips are placed on the base part; and
        at least one protective part, wherein the at least one protective part is integrated with the base part and extends outwards from the base part, and at least partially covers the at least two RF strips placed on the base part.

2. The RF crossover apparatus according to claim 1, wherein the ceramic material is a ceramic based material sintered at low temperatures.

3. The RF crossover apparatus according to claim 1, wherein the at least one insulation layer is located on a surface of the at least one protective part, wherein the surface of the at least one protective part does not face the at least two RF strips.

4. The RF crossover apparatus according to claim 1, wherein at least one RF strip of the at least two RF strips on the body does not come in contact with the at least one protective part.

5. The RF crossover apparatus according to claim 4, the at least one RF strip of the at least two RF strips extends towards an intersection point of the at least two RF strips.

6. The RF crossover apparatus according to claim 5, wherein the at least one insulation layer is located on a surface of the at least one protective part, wherein the surface of the at least one protective part does not face the at least two RF strips.

7. The RF crossover apparatus according to claim 1, further comprising a matching circuit, wherein the matching circuit provides transmission to chip devices provided in the microwave systems on tips of the at least two RF strips on the body.

8. The RF crossover apparatus according to claim 7, wherein the matching circuit is configured in a way to provide impedance matching with the chip devices.

9. A radio frequency (RF) crossover apparatus suitable for a use with microwave systems, comprising: at least one body, at least two RF strips transmitting RF signals and placed to intersect each other on the body, and at least one insulation layer, wherein the at least one insulation layer is placed on at least one surface of the body and insulates the at least two RF strips at least from an external environment, and the body is formed of a ceramic material and is configured for an operation in high frequencies, and wherein the at least one insulation layer comprises at least one perforated transition configured to increase a spectral band and decreasing transmission losses by increasing an insulation between a RF earthing material and the at least two RF strips.

10. A radio frequency (RF) crossover apparatus suitable for a use with microwave systems, comprising: at least one body, at least two RF strips transmitting RF signals and placed to intersect each other on the body, and at least one insulation layer, wherein the at least one insulation layer is placed on at least one surface of the body and insulates the at least two RF strips at least from an external environment, and the body is formed of a ceramic material and is configured for an operation in high frequencies, and wherein the at least one body comprises a plurality of bodies, wherein the plurality of bodies are arranged in a stacked configuration to form a multilayer structure.

11. The RF crossover apparatus according to claim 10, further comprising at least one earthing layer on outside facing surfaces of the plurality of bodies for providing equipotential earthing between the plurality of bodies.

12. A method of obtaining an RF crossover apparatus suitable for use in microwave systems according to claim 10, comprising:
    assembling the plurality of bodies by baking at high temperatures, and
    applying an earthing layer on outer surfaces of the plurality of bodies after the plurality of bodies are assembled.

* * * * *